(12) United States Patent
Wang

(10) Patent No.: US 7,295,444 B1
(45) Date of Patent: Nov. 13, 2007

(54) DELIVERING CHILLED AIR TO COMPONENTS IN A HARDWARE CABINET

(75) Inventor: David G. Wang, San Diego, CA (US)

(73) Assignee: NCR Corporation, Dayton, OH (US)

( * ) Notice: Subject to any disclaimer, the term of this patent is extended or adjusted under 35 U.S.C. 154(b) by 212 days.

(21) Appl. No.: 10/749,582

(22) Filed: Dec. 31, 2003

(51) Int. Cl.
*H05K 5/00* (2006.01)

(52) U.S. Cl. .................. 361/752; 361/688; 361/790

(58) Field of Classification Search ............... 361/752, 361/800, 797, 790, 687–688, 692, 694; 174/17 VA
See application file for complete search history.

(56) References Cited

U.S. PATENT DOCUMENTS

| | | | | |
|---|---|---|---|---|
| 5,414,591 A | * | 5/1995 | Kimura et al. | 361/695 |
| 6,186,890 B1 | * | 2/2001 | French et al. | 454/184 |
| 6,222,729 B1 | * | 4/2001 | Yoshikawa | 361/695 |
| 2003/0035264 A1 | * | 2/2003 | Hartel et al. | 361/678 |

* cited by examiner

*Primary Examiner*—Dean A. Reichard
*Assistant Examiner*—Hung S Bui
(74) *Attorney, Agent, or Firm*—John Cowart

(57) ABSTRACT

A hardware cabinet includes a chassis that is designed for mounting multiple heat-generating electronic systems and a door that allows access into the cabinet. The door has a solid face that extends from the top portion of the door along the majority of the door's length. An opening formed in a lower portion of the door allows chilled air to enter the cabinet. The chassis is structured so that, when electronic systems are mounted in the cabinet, a plenum is formed between the door and the electronic systems. The plenum allows air entering the cabinet to rise between the door and the electronic systems.

5 Claims, 4 Drawing Sheets

DELIVERING CHILLED AIR TO COMPONENTS IN A HARDWARE CABINET

BACKGROUND

The large racks of computing and related hardware equipment that are often found in large data centers present a particularly difficult cooling challenge. Most equipment of this type is cooled using forced-air techniques that are aimed at moving cold air from a cold-air source to the hot components inside the racks. One common technique involves delivering cold air through perforated tiles in a raised floor on which the racks sit.

FIG. 1 shows how this forced-air cooling technique is designed to work in an ideal setting with a conventional hardware cabinet 100. Air flowing through one or more perforated tiles 110 in a raised floor 120 rises in front of the hardware cabinet 100 and passes through its front door 130. The front door 130 of the cabinet 100 is perforated to allow penetration of the cold air into the cabinet 100. The cold air distributes itself evenly and fully along the length of the cabinet, so that all of the air flowing through the perforated tile 110 enters the cabinet. Heat-generating electronic systems $140_1 \ldots _X$ are mounted inside the cabinet up against or very near the front door 120. In the ideal setting, each of the heat-generating systems $140_1 \ldots _X$ receives the amount of incoming cold air that its own internal air-moving device (e.g., fan) is capable of moving.

Reality, however, very rarely reflects this ideal. In most data centers, chilled air is supplied by one or more air-conditioning (A/C) units with cooling capacities that are determined by the expected total heat load or power consumption of all heat-producing equipment contained within the data center. While the cooling capacities of these A/C units are typically adequate for removing an amount of heat equal to that generated by the equipment in the data center, the amount of chilled air that is actually delivered to the various hardware cabinets varies quite significantly in relation to a number of factors. For example, the flow of chilled air to a particular hardware cabinet depends largely on the under-floor static pressure, which in turn is dependent upon the distance over which the chilled air must travel from the A/C handlers to reach each cabinet. As data centers grow increasingly large and the number of hardware cabinets contained in the typical data center increases rapidly, the physical area covered by the data center grows, which leads to greater travel distances for chilled air delivered by each A/C unit in the data center. Another factor influencing the delivery of chilled air is the amount of air that can flow through the perforated tiles over a given period of time. The placement of the tiles also impacts the flow of chilled air to the hardware cabinets. Quite often, the perforated tiles that were installed when the data center was first populated are not sufficient to handle the current cooling requirements of the data center. Even in cases where a large amount of tile perforation is provided, inadequate under floor static pressure will result in insufficient chilled air delivery.

One condition that frequently results from these and other factors is an insufficient supply of chilled air to hardware cabinets. According to laws of physics, hot air rises and cold air stays low, resulting in air stratification with the hottest air at the top of the cabinet and the coldest air at the bottom. Without chilled air being delivered upwards through the perforated tiles, every heat-generating system inside the cabinet will be exposed to the ambient temperature that prevails at its corresponding elevation. Insufficient chilled air delivery leads to a mixing of hot exhaust air with the incoming chilled air at certain elevations, which hinders and in some cases prevents the cooling of components in the hardware cabinets.

FIG. 2 shows a hardware cabinet 200 that suffers from an insufficient supply of chilled air 210. The heat-generating systems $240_1 \ldots _X$ in the lower portion of the cabinet 200 pull all of the available chilled air 210 through the perforated door 220 before any of the air has risen the full length of the cabinet. As a result, very little, if any, of the chilled air is available to the heat-generating systems in the upper portion of the cabinet, and these systems begin to take in hot air 230 that has exhausted through and then risen along the back of the cabinet. This recirculation of hot air through the upper portion of the cabinet causes the components in that area to heat even further and, in many cases, to ultimately fail altogether.

The equipment in a data center is typically designed and certified to operate within a specific range of temperatures (e.g., 10° C. to 35° C.). When an insufficient supply of chilled air reaches a hardware cabinet in the data center, a high temperature gradient develops between the top and bottom of the cabinet. This causes the equipment at the top of the rack to reach its upper temperature limit long before the equipment at the bottom of the cabinet does, even though the chilled air delivered through perforated tiles is still well within the specified range. When this occurs, the acceptable range of temperature fluctuation in the chilled air coming through the perforated tiles is much less than it was designed to be.

SUMMARY

A hardware cabinet includes a chassis that is designed for mounting multiple heat-generating electronic systems and a door that allows access into the cabinet. The door has a solid face that extends from the top portion of the door along the majority of the door's length. An opening formed in a lower portion of the door allows chilled air to enter the cabinet. The chassis is structured so that, when electronic systems are mounted in the cabinet, a plenum is formed between the door and the electronic systems. The plenum allows air entering the cabinet to rise between the door and the electronic systems.

Other features and advantages will become apparent from the description and claims that follow.

DETAILED DESCRIPTION

Figure 1:
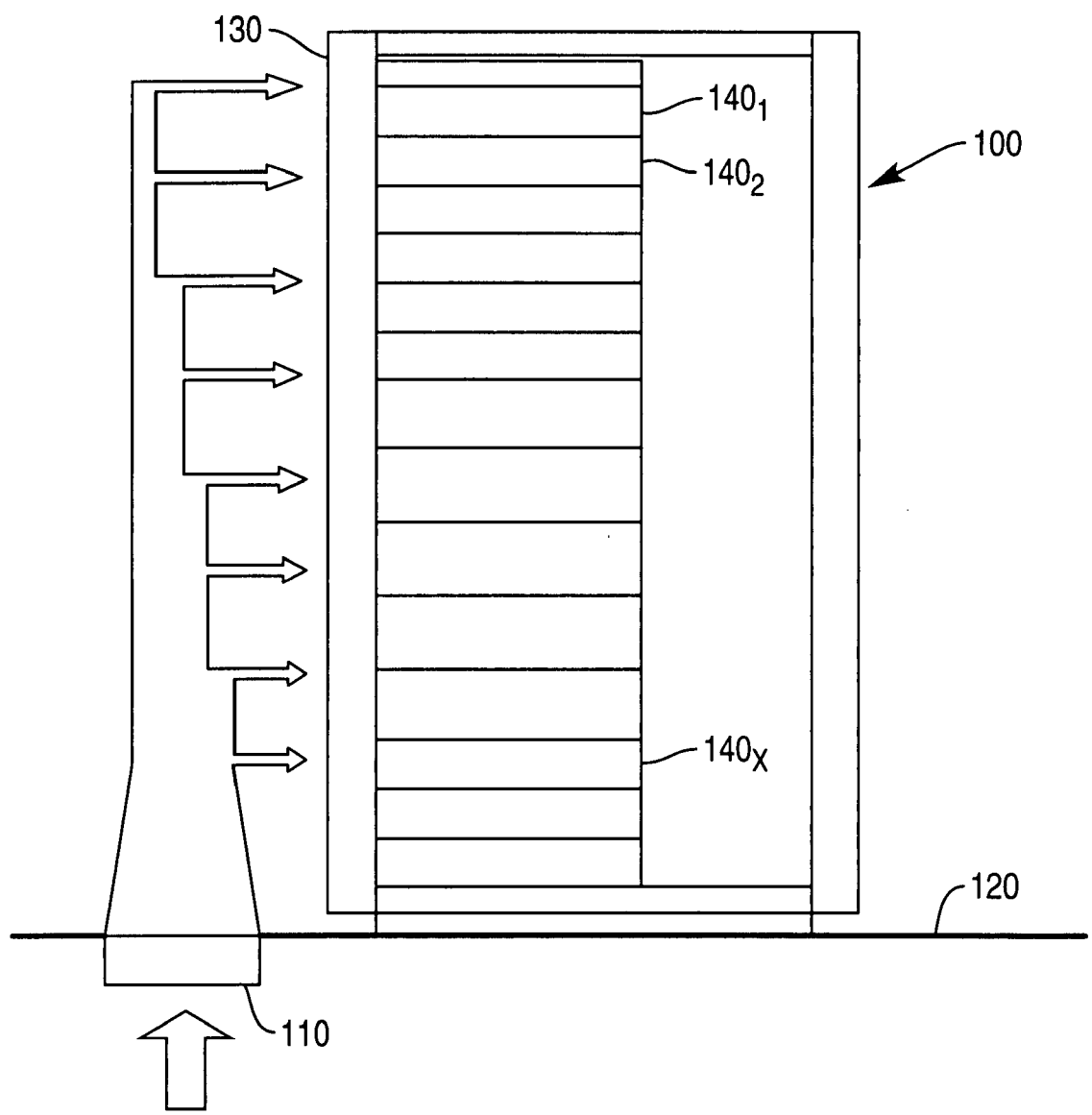
FIG. 1 is schematic diagram of a conventional hardware cabinet that experiences ideal forced-air cooling conditions.
Figure 2:
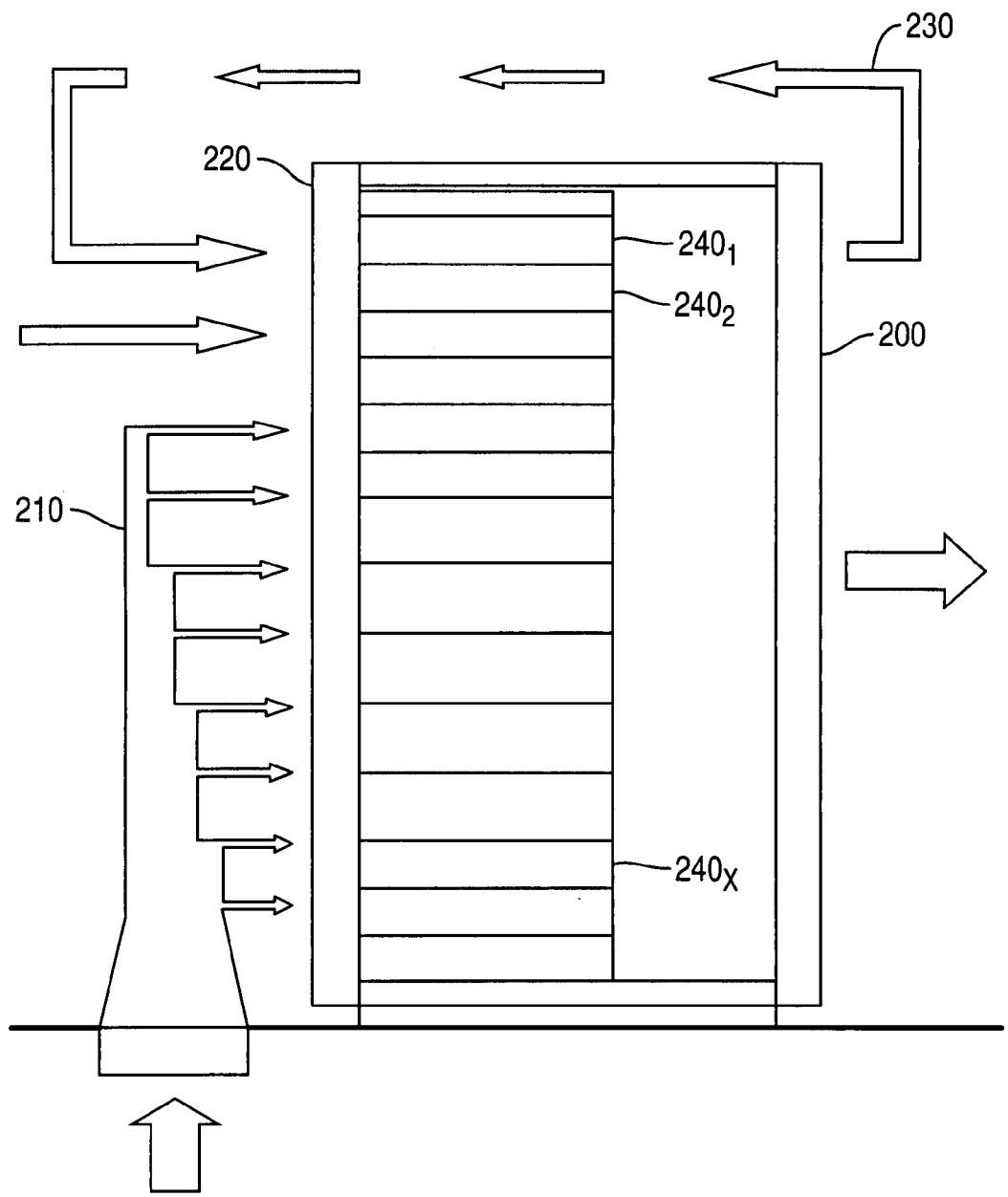
FIG. 2 is a schematic diagram of a conventional hardware cabinet that experiences an insufficient supply of chilled air.
Figure 3:
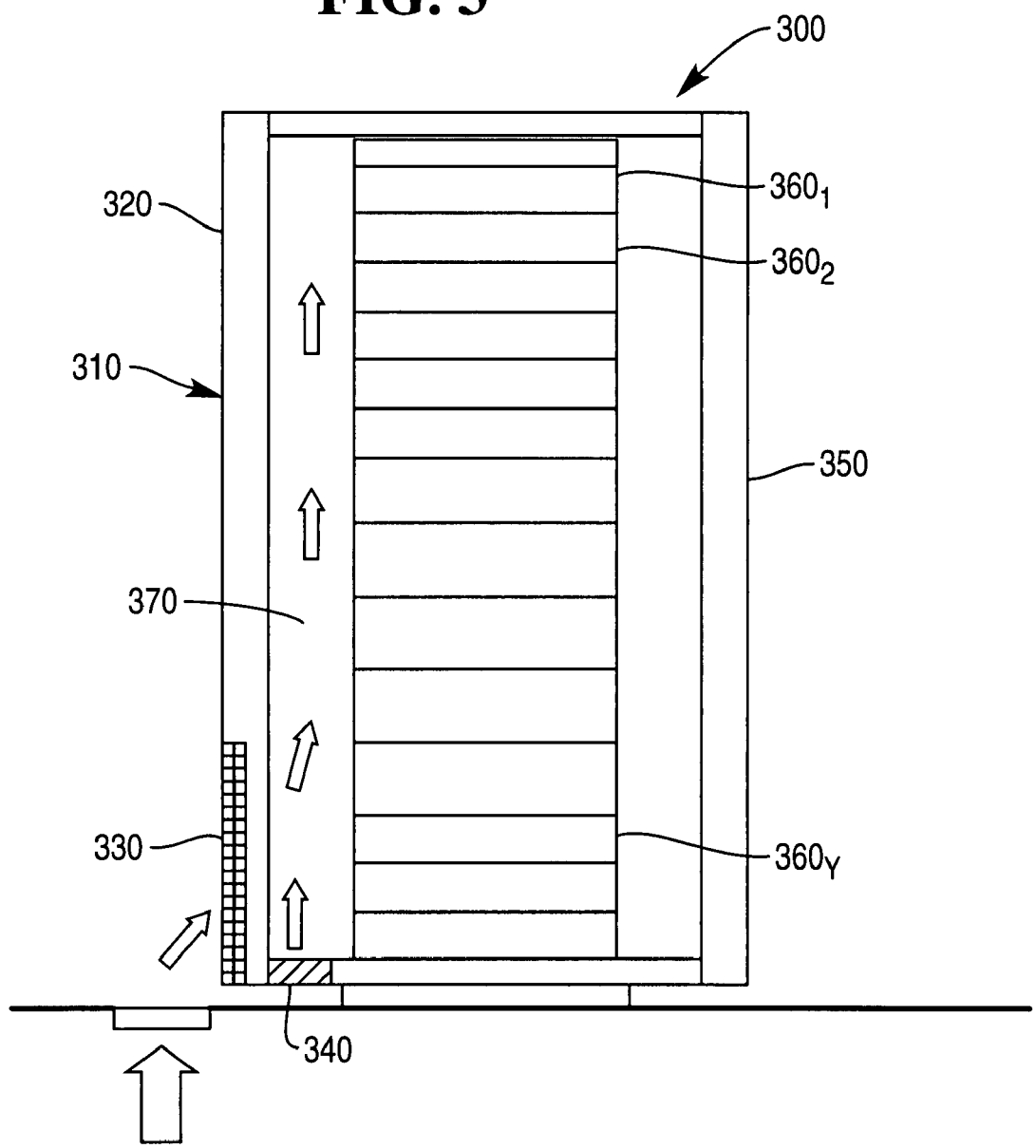
FIG. 3 is a schematic diagram of a hardware cabinet in which a supply of chilled air is directed along the cabinet's length through a hollow plenum formed between the cabinet's front door and the heat-generating systems mounted inside.

FIG. 3 shows a hardware cabinet 300 designed to inhibit the flow of hot exhaust air back into the cabinet 300. The cabinet 300 includes several unique features that work together to achieve this result. Unlike doors of conventional hardware cabinets, the door 310 of this cabinet 300 has a solid surface 320 that extends along the majority of the door's length, including the upper portion of the door where hot exhaust air typically enters back into the conventional cabinet. The lower portion of the door 310 includes a perforated panel or screen 330 that allows cool air near the floor to enter the cabinet. In general, the screen 330 is occupies a substantially smaller portion of the door 310 than the solid surface 320 occupies. In some embodiments, the cabinet 300 also includes an opening 340 on its underside to further increase the flow of air into the cabinet 300.

The cabinet chassis 350 is structured so that the heat-generating electronic systems $340_{1...Y}$ mounted within the chassis 350 are not mounted against or very near the front door 310 as they are in conventional cabinets. Instead, the heat-generating systems $340_{1...Y}$ are separated from the cabinet door 310 by an air gap, or plenum 370, which allows air to move along the full length of the cabinet. As a general rule, this air includes both the chilled air coming through the perforated tiles and warmer air from higher elevations in the cabinet, which mix together and pressurize, thus assisting delivery of the cooling air to the heat-generating systems within the cabinet.

Because the cabinet 300 and its front door 310 have one or more openings 330, 340 very close to the floor level, the hot exhaust air near the top of the cabinet does not easily flow back into the cabinet. The solid face 320 at the top of the door 310 blocks the flow of the hot exhaust air into the cabinet. All of the air that the cabinet requires for cooling is drawn through the screen 330 in the lower portion of the door and the opening 340 in the bottom of the cabinet. Because these air inlets lie at or near floor level, where chilled air is supplied through the perforated tiles and where the ambient air is relatively cold, the ratio of chilled air to warm air inside the cabinet 300 is much greater than in a conventional cabinet, and thus the heat-generating systems in the cabinet cool more quickly.

Figure 4:
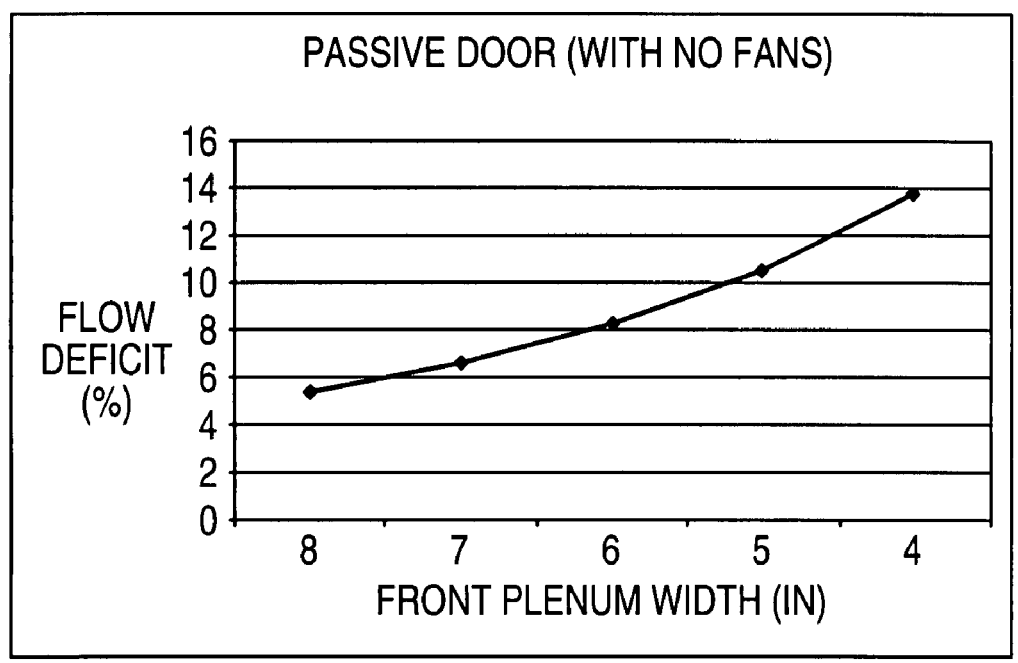
FIG. 4 is a graph showing the relationship between volumetric airflow in a hardware cabinet and the width of a plenum inside the cabinet.

Because the front door 310 of the cabinet is not perforated along its entire length, as the doors on conventional cabinets are, the door impedes the flow of air to the heat-generating systems. The amount of this impedance is a function of the size of the openings 330, 340 and the depth of the plenum 370. FIG. 4 is a graph showing the relationship between volumetric airflow in the cabinet and the width of the plenum inside the cabinet, where the sizes of the openings 330, 340 are held constant. The vertical axis of the graph shows the percentage of airflow deficit—i.e., the percentage by which the total airflow in the cabinet falls short of what would be available in a conventional cabinet of similar qualities—in a test cabinet installed in a test environment. In this particular cabinet, a plenum width of four inches created an airflow deficit of approximately 14%; a plenum width of eight inches reduced the airflow deficit to approximately 5%. Increasing the plenum width, of course, requires moving the heat-generating systems further back into the cabinet chassis. The minimum required plenum width to ensure adequate airflow in any given cabinet depends on a variety of factors, including the sizes of the inlet openings, the characteristics of the heat-generating systems inside the cabinet, and the characteristics of the fans used in the heat-generating systems.

The text above describes one or more specific embodiments of a broader invention. The invention also is carried out in a variety of alternative embodiments and thus is not limited to those described here. Many other embodiments are also within the scope of the following claims.

I claim:

1. A hardware cabinet comprising:
   a chassis configured for mounting multiple heat-generating electronic systems; and
   a door mounted to the chassis to allow access into the cabinet;
   where the chassis and the door together define exterior surfaces for the cabinet;
   where the door includes:
   a solid face that extends from a top portion of the door along a majority of the door's length; and
   a first opening formed in a lower portion of the door to allow chilled air to enter the cabinet through one of the exterior surfaces;
   where the chassis is structured so that, when electronic systems are mounted in the cabinet, a plenum is formed between the door and the electronic systems, such that air entering the cabinet is able to rise between the door and the electronic systems; and
   where the cabinet also comprises a second opening positioned to allow chilled air to enter the cabinet through another of its exterior surfaces.

2. The cabinet of claim 1, where the second opening is positioned directly below the plenum.

3. The cabinet of claim 1, where the second opening is positioned near the door.

4. The cabinet of claim 1, where the door includes a screen placed over the opening.

5. The cabinet of claim 1, where the second opening is positioned in the chassis.

* * * * *